United States Patent [19]

Meisner et al.

[11] Patent Number: 4,948,949
[45] Date of Patent: Aug. 14, 1990

[54] SWITCH MODULE ARRANGEMENT FOR USE WITH RESISTIVE-TYPE LOADS

[75] Inventors: Alfred Meisner, Nuremberg; Walter Spitzl, Heroldsberg, both of Fed. Rep. of Germany

[73] Assignee: Diehl GmbH & Co., Nuremberg, Fed. Rep. of Germany

[21] Appl. No.: 346,364

[22] Filed: Apr. 27, 1989

Related U.S. Application Data

[63] Continuation of Ser. No. 99,131, Jul. 21, 1987, abandoned.

[30] Foreign Application Priority Data

Oct. 17, 1986 [DE] Fed. Rep. of Germany ....... 3635324

[51] Int. Cl.⁵ .............................................. H05B 1/02
[52] U.S. Cl. .................................. 219/446; 219/448; 219/453; 219/506; 200/296
[58] Field of Search ............... 219/446, 448, 447, 451, 219/452, 453, 506, 492, 105.5 B, 455, 483, 486; 361/392, 350; 200/296

[56] References Cited

U.S. PATENT DOCUMENTS

| | | | |
|---|---|---|---|
| 2,424,412 | 7/1947 | Myers | 219/448 |
| 3,337,708 | 8/1967 | Cerveny | 200/296 |
| 4,156,804 | 5/1979 | Piber | 200/296 |
| 4,187,528 | 2/1980 | Morriss | 361/399 |
| 4,406,936 | 9/1983 | Ohashi | 200/296 |
| 4,431,907 | 2/1984 | Barnett | 219/452 |
| 4,493,979 | 1/1985 | Bredel | 219/463 |
| 4,527,049 | 7/1985 | Thomas | 219/451 |
| 4,550,276 | 10/1985 | Callahan et al. | 315/312 |
| 4,604,518 | 8/1986 | Payne | 219/453 |
| 4,634,842 | 1/1987 | Payne | 219/486 |
| 4,695,711 | 9/1987 | McGeorge | 219/506 |
| 4,714,822 | 12/1987 | Braun | 219/452 |
| 4,715,569 | 12/1987 | Essig | 200/296 |

FOREIGN PATENT DOCUMENTS

| | | |
|---|---|---|
| 0155546 | 9/1985 | European Pat. Off. . |
| 2150703 | 4/1973 | Fed. Rep. of Germany . |
| 2848824 | 5/1980 | Fed. Rep. of Germany . |
| 1565498 | 7/1980 | Fed. Rep. of Germany . |
| 8012439 | 11/1985 | Fed. Rep. of Germany . |
| 8702539 | 4/1987 | PCT Int'l Appl. . |
| 2036441 | 6/1980 | United Kingdom . |
| 2041673 | 9/1980 | United Kingdom . |

*Primary Examiner*—Teresa J. Walberg
*Attorney, Agent, or Firm*—Scully, Scott Murphy & Presser

[57] ABSTRACT

An arrangement for regulating the power output of resistive loads or electrical appliances, especially the cooking plates of electric ranges, which includes actuating elements for the switching on and preselection of power stages or steps for the load devices, relays for the supply of power, and incorporating an electronic control circuit for regulating the conductance of electrical power to the resistive loads.

6 Claims, 3 Drawing Sheets

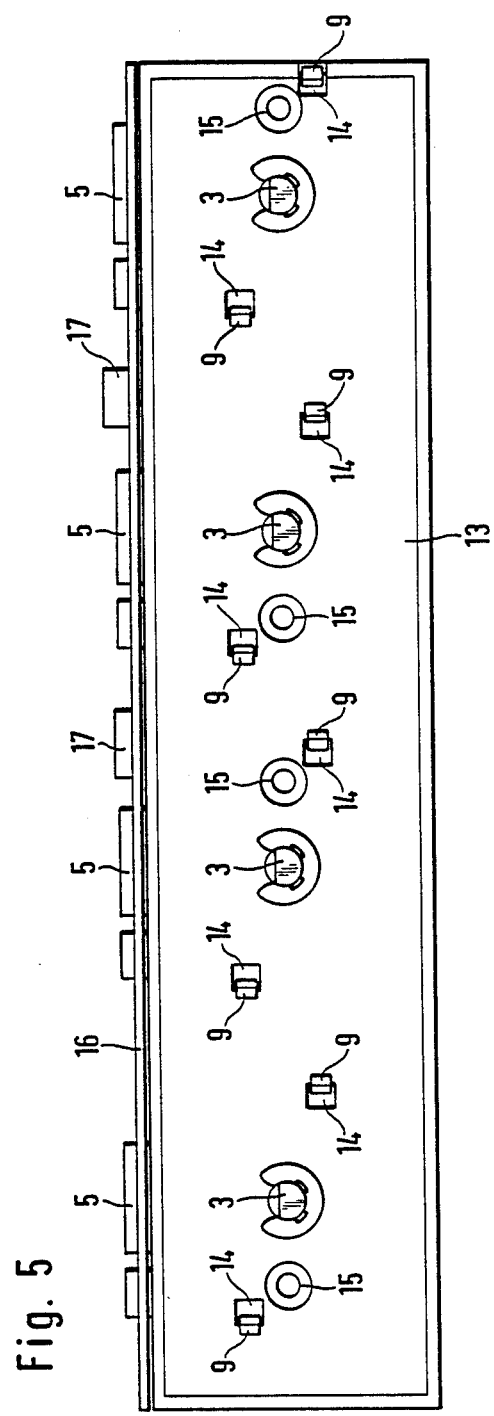
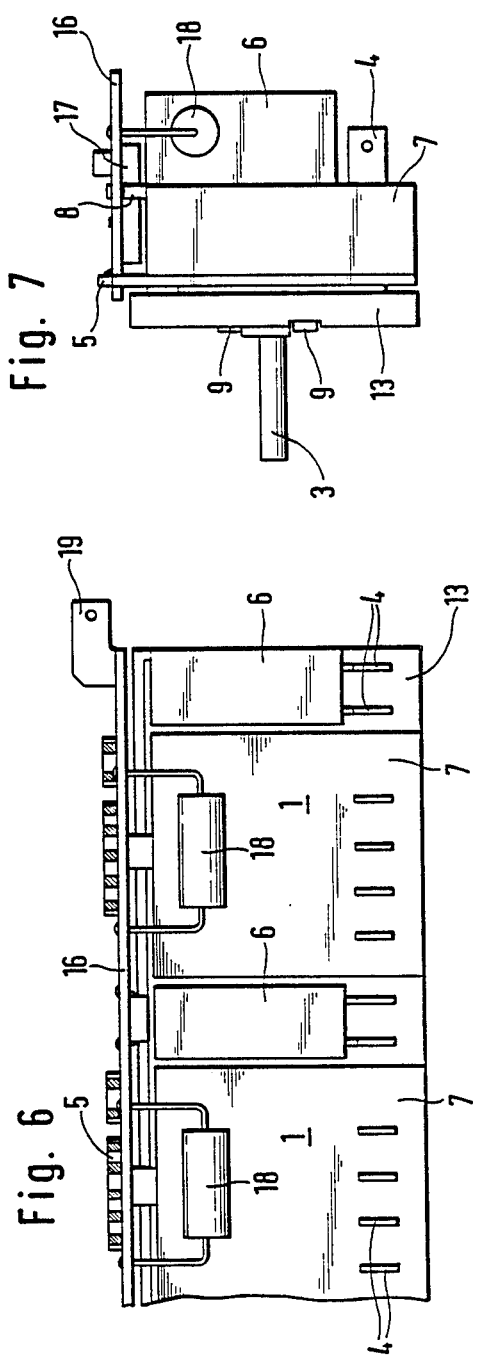

SWITCH MODULE ARRANGEMENT FOR USE WITH RESISTIVE-TYPE LOADS

This application is a continuation of application Ser. No. 099,131, filed Sept. 21, 1987 now abandoned.

BACKGROUND OF THE INVENTION

1. Field of the Invention

The present invention relates to an arrangement for regulating the power output of resistive loads or electrical appliances, especially the cooking plates of electric ranges, which includes actuating elements for the switching on and preselection of power stages or steps for the load devices, relays for the supply of power, and incorporating an electronic control circuit for regulating the conductance of electrical power to the resistive loads.

2. Discussion of the Prior Art

In the current state-of-the-technology, a considerable array of arrangements for regulating electrical power has already become known, especially for range-top cooking plates. For example, it has become known from the disclosure of German Laid-Open Patent Appln. No. 21 50 703, to position an array of power regulating arrangements within a single housing, and to employ a common pulse generator for the actuation of the electrical load.

From the disclosure of German Laid-Open Patent Appln. No. 15 65 498 there has also become known an arrangement for the regulating of power, in which a plurality of power regulators for range-top cooking plates are arranged on a common axis, and are in mechanical interconnection with a range timer. As a result thereof, the power regulation over the ohmic consumers is implemented in a mechanical mode.

Finally, from the disclosure of German Patent No. 28 48 824 there has become known an arrangement for regulating the power of cooking plates, in which regulators for two cooking locations are combined within a single housing, and wherein a common electrical control circuit is provided for both regulators.

In previous years, the requirements for such types of arrangements for regulating the power of cooking plates have continually changed, in that there is now present a demand for a wide range of variability in the capacity of conforming to the wishes of the individual employers for such arrangements; in essence, the manufacturers of cooking ranges. This is applicable, on the one hand, to the spatial arrangement of the individual power regulators among each other, as well as, on the other hand, also to the electronic control over the individual power regulators.

SUMMARY OF THE INVENTION

Accordingly, it is an object of the present invention to improve upon an arrangement for regulating the power of resistive loads of the above-mentioned type, which will provide a considerable capacity for conforming to the wishes of the employer respecting the spatial positioning of the individual power regulators and of the electronic control for the conductance of power to the individual resistive loads or electrical appliances.

In order to achieve the foregoing object pursuant to the present invention, the arrangement for regulating the power output of resistive loads includes, in an operative combination, a plurality of switch modules possessing actuating elements and relays; a common electronic control circuit, especially in the form of a microprocessor; and a frame unit which has variable dimensions and spacings between bore openings in which there can be fastened a plurality of switch modules.

In order to attain the necessary correlation capability or adaptability, the invention originates from the concept that the individual power regulators are constituted as switch modules which are actuated from a common control circuit, and which can be fastened in the desired quantity within a frame unit which is configured in accordance with the wishes of a customer.

In accordance with the intended purpose of utilization, the individual switch modules can be connected through the intermediary of plugs and signal lines with a central, but spatially separately located microprocessor; however, they can also be actuated by means of an electronic control circuit in conformance with the specifications of the customer, which is arranged on a wired or printed circuit board positioned on the frame unit. Consequently, because of these conditions, it is possible to actuate the individual switch modules through a range timer which is already located in the range with its microprocessor, or for ranges without a timer, to operate the switch modules through an electronic control circuit which is in accordance with the specifications of a customer, and to create a constructive unit for the respective customers, which possesses the switch module in the desired quantity and spatial arrangement, as well as with the desired electronic control circuit.

BRIEF DESCRIPTION OF THE DRAWINGS

Reference may now be had to the following detailed description of exemplary embodiments of the invention, taken in conjunction with the accompanying drawings; in which:

FIG. 5 illustrates a front view of a frame unit for four switch modules;

FIG. 6 illustrates a rear view of at least two switch modules arranged within a frame unit; and FIG. 7 illustrates a right-side view of the frame unit of FIG. 5.

DETAILED DESCRIPTION

Figure 1:
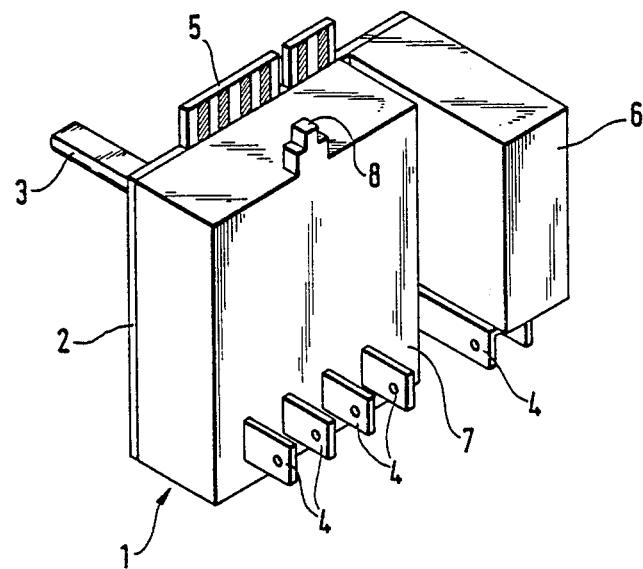
FIG. 1 illustrates a perspective rear view of a single switch module pursuant to the invention.

The switch module 1 is constructed on a wired or printed circuit board plate 2 which, in addition to the contact tracks or paths (not shown), carries the actuating shaft or axle 3 for the power adjustment of the resistive loads, as well as further power terminal contacts 4 and signal line connections 5. The internal construction of such a switch module is not the subject matter of the invention and, as a result, is not described in further detail herein. The rear side of the printed circuit board further carries a relay 6 for the switching of the load. The remaining portion of the printed circuit board is closed off by a rear wall housing 7, which incorporates a protuberance 8 at its upper side, the significance of which is elucidated further on hereinbelow.

Figure 3:
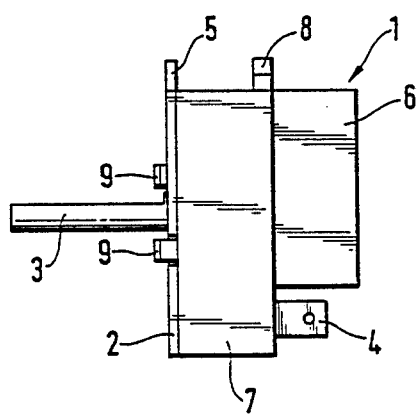
FIG. 3 illustrates a right-side view of the switch module.
Figure 2:
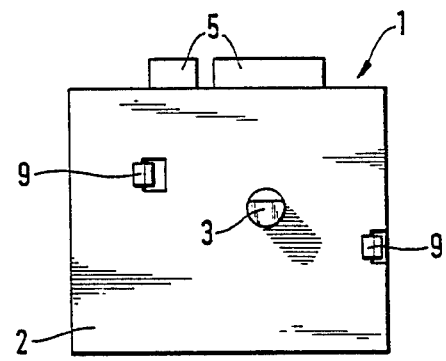
FIG. 2 illustrates a front view of the switch module.

In FIGS. 2 and 3, on the front side of the printed circuit board 2 of the switch module, in addition to the actuating axle 3, there can be ascertained two flexible tongues 9, by means of which the switch module is snapped onto the frame unit, as is elucidated upon in detail further on hereinbelow.

Figure 4:
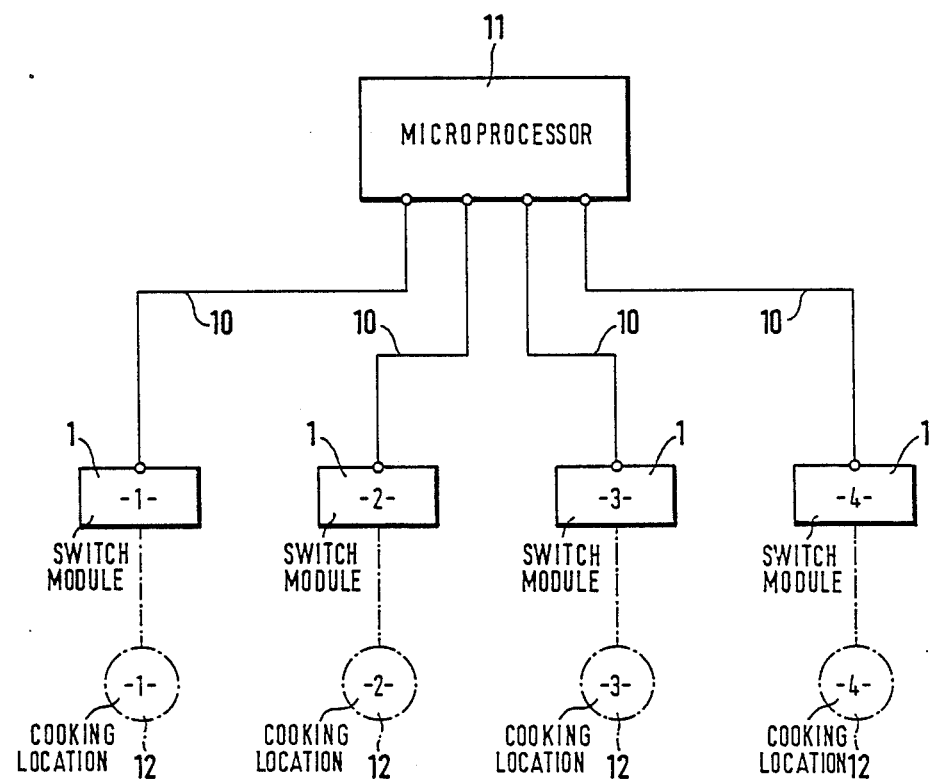
FIG. 4 illustrates a block circuit diagram of the electrical actuation system for the switch module through the intermediary of a centralized microprocessor.

Illustrated in FIG. 4 are four switch modules 1 which are connected by electrical signal lines 10 with a central microprocessor 11. This microprocessor can be arranged in the range at a location which is a spatially remote from the switch modules 1. Preferably, employed for this purpose is a microprocessor which is already present within a kitchen range timer, and which is additionally utilized for undertaking the regulation of the power for the cooking locations 12 by means of the switch modules 1.

In FIG. 5 there is illustrated the front view of a frame unit 13. Ascertainable are four actuating shafts or axles 3 for four switch modules which are arranged on the rear side of the frame unit, as well as openings 14 into which there engage the resilient tongues 9 of the switch modules. Through the bore openings 15 there is implemented the attachment of the frame unit to a range hood or counter top (not shown).

Fastened to the upper surface of the frame unit 13 in a manner not described herein, at a right angle thereto, is a printed circuit board or conductor plate 16. This printed circuit board carries electronic components 17 which represent an electronic control circuit common to all switch modules and which is configured in compliance with the wishes of the customer.

The spacings between the bore openings for the actuating axles 3 can be varied in accordance with the wish of the customer, as well as the openings 14 for the resilient tongues 9. This spacing is downwardly limited only by the spatial expanse between two switch modules which are to be arranged adjacent each other.

Represented in FIG. 6 is a rear view of such a frame unit with two switch modules 1. In this instance, besides the already above-described components there can also be ascertained the impedances 18. Provided on the printed circuit board 16 is a network power supply connecting lug 19 for the supply of current to the printed circuit board.

In FIG. 7 there can be ascertained a representation, from the right side, of the arrangement pursuant to FIG. 5. The printed circuit board 16 is soldered at one side thereof to the plug connections 5 for the signal lines, and at another location supports itself against the protuberance 8 on the rear wall of the housing 7.

The inventive arrangement facilitates a broad range of variations of possible configurations for frame units and their operative interconnection with a plurality of switch modules.

What is claimed is:

1. An arrangement for switching control modules which regulate the power output of resistive loads, such as cooking plates of electric ranges, said switch modules including actuating elements enclosed in a housing for activation and preselection of power stages for the resistive loads, with relays for supply of power and an electronic control circuit for regulating conductance of power to the resistive loads; comprising, in combination:

(a) a plurality of switch modules including actuating elements and relays, said switch modules having a box-like housing having a front and back face, said front face having at least one resilient tab, each said switch module including a printed circuit board with plug connectors for connection to a power supply and signal lines, such that said switch modules are connected through said plug connectors to the signal lines which connect to a remotely located microprocessor arranged in a range timer;
   (b) a common electronic control circuit remote from said modules including said microprocessor for said plurality of switch modules; and
   (c) a frame unit having spaced openings for fastening said plurality of said switch modules; wherein said at least one tab of each switch module connects by snap-action to said spaced openings of said frame unit to fasten said switch modules to said frame unit.

2. An arrangement as claimed in claim 1, wherein said frame unit includes a printed circuit board which supports said common electronic control circuit for all of said switch modules.

3. An arrangement as claimed in claim 2, wherein the printed circuit board is attached to and extends perpendicularly from said frame unit.

4. An arrangement as claimed in claim 1, wherein a printed circuit board is attached to the frame unit and has respective terminals thereof connected with the plug connectors for the signal lines of each of the switch modules in said frame unit, said printed circuit board attached to the frame unit being coupled to said common electrical control circuit.

5. An arrangement as claimed in claim 1, wherein each of said switch modules include actuating axles extending from bore openings in said housing, and said resilient tabs inserted into respective openings in the frame unit, and said modules having plug connectors for the signal lines engaging in associated openings in a printed circuit board attached to the frame unit for supporting said common electronic control circuit.

6. An arrangement for regulating the power output of resistive loads, such as cooking plates of electric ranges, including actuating elements for activation and preselection of power stages for the resistive loads, with relays for supply of power and an electronic control circuit for regulating conductance of power to the resistive loads/ comprising, is combination;

(a) a plurality of switch modules including actuating elements in relays, each said switch module comprising a printed circuit board with plug connectors for the supply of power and for signal lines, said switch modules including fastening elements for attaching each said switch module to a frame unit, said switch modules further being connected through plug connectors to said signal lines to a centrally located microprocessor which is arranged in a range timer;
   (b) a common electronic control circuit including said microprocessor for said plurality of switch modules; and
   (c) a frame unit having spaced bore openings for fastening therein a plurality of said switch modules.

* * * * *